United States Patent [19]
Hulme

[11] Patent Number: 5,290,122
[45] Date of Patent: Mar. 1, 1994

[54] PRINTED CIRCUIT BOARD RETAINER

[75] Inventor: Conrad Hulme, Arcadia, Calif.

[73] Assignee: EG&G Birtcher, Inc., El Monte, Calif.

[21] Appl. No.: 983,146

[22] Filed: Nov. 30, 1992

[51] Int. Cl.⁵ .................................................. H05K 7/00
[52] U.S. Cl. .................................. 403/374; 403/409.1; 165/80.2; 439/325
[58] Field of Search ............... 361/386, 382, 383, 384, 361/385, 386, 387, 388, 389; 174/16.3; 165/80.1, 80.2, 80.3; 206/328; 439/325, 326, 327; 403/374, 409.1, 24

[56] References Cited

U.S. PATENT DOCUMENTS

| | | |
|---|---|---|
| 4,480,287 | 10/1984 | Jensen ........................... 361/386 |
| 4,721,155 | 1/1988 | McNulty . |
| 4,751,963 | 6/1988 | Bui et al. . |
| 4,775,260 | 10/1988 | Kecmer ........................ 403/409.1 |
| 4,823,951 | 4/1989 | Colomina . |
| 4,869,680 | 9/1989 | Yamamoto et al. . |
| 4,953,059 | 8/1990 | McNulty . |
| 5,036,428 | 7/1991 | Brownhill et al. . |
| 5,224,016 | 6/1993 | Weisman ........................ 361/386 |

OTHER PUBLICATIONS

*NERAC* Abstracts.

Primary Examiner—Randolph A. Reese
Assistant Examiner—Anthony Knight
Attorney, Agent, or Firm—Greenfield & Sacks

[57] ABSTRACT

A retainer for holding a printed circuit card in a card rack or the like is disclosed. The retainer comprises a plurality of wedge-shaped members slideably mounted end-to-end on a rod, with at least one of those members being moveable in a transverse direction relative to the rod and to its respective adjacent members upon effective shortening of the rod to thereby bring a clamping surface of the transversely moveable member into contact with a printed circuit board and to apply a clamping force thereto. The rod is formed of an alkaline metal alloy that has been tempered to provide the rod with sufficient strength and decreased weight.

11 Claims, 2 Drawing Sheets

PRINTED CIRCUIT BOARD RETAINER

FIELD OF THE INVENTION

The present invention relates to retainer assemblies for clamping a printed circuit board between spaced surfaces within a chassis and more particularly to a retainer having reduced weight and improved thermal conductance.

BACKGROUND OF THE INVENTION

Electronic equipment often employs printed circuit boards or cards. These cards typically are mounted in a chassis or card rack by stacking the cards in row alignment with one another. Row alignment in the chassis is defined by slotted or spaced surfaces within or on the chassis, with each card placed in a slot or between a pair of spaced surfaces. Many applications for such retainers require high performance that will captivate a printed circuit board under the most extreme shock and vibration conditions such as those encountered by spacecraft or military aircraft.

Typical printed circuit board retainers are described in U.S. Pat. Nos. 4,823,951 and 5,036,428, the teachings of which are incorporated herein by reference. Such retainers comprise a partially threaded screw or rod and a plurality of members slideably mounted in an end-to-end relationship on the rod. The members disposed on the rod have wedge-shaped end portions which are engagable with one another. The wedge-shaped end portions serve to move at least one of the members in a transverse direction relative to the rod when the members are moved towards one another along the rod. Such movement may be achieved by providing the rod with screw threads to engage and move the distal-most member when the rod is rotated, or alternatively, the movement may result from the action of a lever assembly used to draw the rod away from the distal-most member, thereby pulling that member toward its companions.

The transverse direction in which the member is moved acts to engage a clamping surface of that member against an edge of the printed circuit board. The opposite edge of the board is thereby forced into contact with, and clamped against, a spaced surface fixedly connected to or integral with the chassis in which the board is to be mounted.

Commonly, the rod in prior art retainers is threaded at one end to engage with mating threads on a nut attached to one of the end-most sliding members mounted on the rod. The opposite end of the rod includes a portion that may be engaged by a tool to allow the rod to be rotated. In so doing, the members are moved toward one another as the threaded rod is rotated in the tightening direction.

In many high performance applications, the printed circuit board chassis comprises a sealed box which does not allow cooling air to pass over the circuit board. Rather, heat generated by the circuit board is conducted through a metal heat sink attached to the printed circuit board and then transmitted to a heat exchanger or plenum. One critical thermal interface in the heat transfer path becomes the printed circuit board retainer itself.

In addition, it is desirable to reduce as much weight as possible in components used in high performance applications such as spacecraft and military aircraft. Typically, weight reduction is achieved by substituting light-weight, and other exotic, materials for conventional materials. For example, aluminum, titanium and various composite materials are used in aircraft to replace materials such as steel.

In the case of the circuit board retainers described above, however, stainless steel has been the material of choice for forming the rod element, due to the perception that lighter materials lacked the tensile strength and other physical properties needed to adequately clamp a circuit board into position. Thus, these retainers continue to use stainless steel rods despite the weight of that material which may cause such rods to account for approximately one-third to one-half of the weight of the entire retainer.

As a result of the use of circuit board retainers in various high performance applications, a need exists for retainers which efficiently transmit or release forces applied between the rod and the slideable members mounted on the rod while minimizing weight of the retainer unit and maximizing its thermal conductance properties.

SUMMARY OF THE INVENTION

In accordance with the purposes of the invention as embodied and described herein, the assembly for holding a printed circuit board between the surfaces provided comprises: a rod and a plurality of members slideably mounted in an end-to-end relationship on the rod. At least one of the members includes an internal longitudinal channel with a transverse dimension greater than the corresponding outside dimension of the rod, to thereby permit movement of the member along a transverse (radial) path relative to the rod. The member which moves transversely relative to the rod and the members adjacent to that member each have end portions engagable with one another. These end portions are shaped to force the transversely movable member in its transverse direction upon forcing of the members toward one another along the rod. With sufficient movement in the transverse direction, the member engages and clamps a printed circuit board against a fixed surface. Unlike the circuit board retainers known in the prior art, the retainer of the present invention employs a rod fabricated of a light-weight, high-tensile strength material such as an alkaline metal alloy. One example of such alloys is 7075 aluminum, an alloy of aluminum, zinc, magnesium, copper and chromium. The rod is tempered using a process which provides it with mechanical properties substantially similar to those of the heavier stainless steel. The use of such a rod provides a substantial weight reduction to the circuit board retainer and enhances its ability to conduct heat away from the circuit board.

In use, the rod and slideably mounted members forming the retainer are received in a recess defined by first and second sidewalls of the chassis used to hold the circuit board. The recess has a width greater than the combined width of the transversely moveable member and the edge of the printed circuit board which is to be retained by the assembly.

Additional features and advantages of the invention will be set forth in the description which follows, making reference to the accompanying figures.

DETAILED DESCRIPTION OF THE INVENTION

Figure 1:
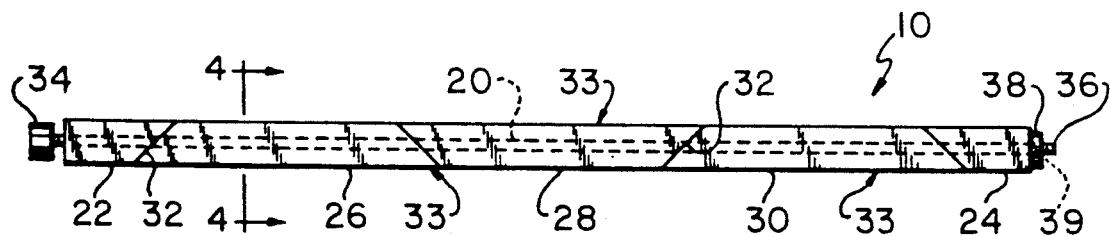
FIG. 1 is a schematic representation of one embodiment of a circuit card retainer of the present invention in its unexpanded configuration.
Figure 2:
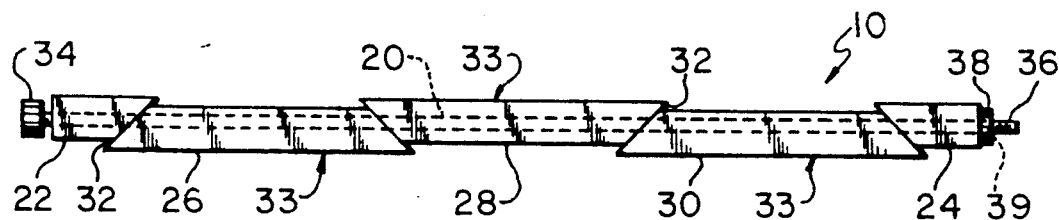
FIG. 2 is a schematic representation of one embodiment of a circuit card retainer of the present invention in its expanded configuration.

FIGS. 1 and 2 are top views of a retainer 10 which comprises a rod 20 having a plurality of slideable members mounted thereon. As will be described in detail shortly, the rod 20 is fabricated of an alkaline metal alloy having mechanical properties approximating or surpassing those of stainless steel. In the embodiments shown, the plurality of slideable members includes end members 22 and 24, and intermediate members 26, 28 and 30. Intermediate members 26 and 30 are disposed adjacent to member 28 and respective end members 22 and 24.

Figure 4A:
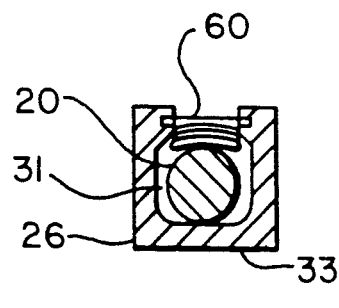
FIG. 4A is a is a cross-sectional view of the retainer of FIG. 1 taken along line I—I illustrating an optical leaf spring which biases a respective member against a rod.

As shown in FIG. 4A, each intermediate member 26, 28 and 30 is configured with an internal longitudinal channel 31 having a transverse dimension greater than the corresponding outside dimension of the rod 20 so as to permit movement of the members along transverse directions 56 and 58 relative to the rod (as will be described in detail below). End members 22 and 24 are also configured with an internal longitudinal channel for receiving rod 20, although the channel formed in the end members need not be formed with as great a transverse dimension as the channels of the intermediate members, since the end members are not required to move transversely relative to the rod.

Each end of the intermediate members 26, 28 and 30 is configured with an inclined (wedge-shaped) surface 32 which mates with and slideably contacts the inclined surface 32 of an adjacent member. Similarly, the end members 22 and 24 each include an inclined surface 32 formed on one end thereof which mates with and slideable contacts one end of a respective intermediate member 26 and 30. Additionally, intermediate members 26 and 30 have clamping surfaces 33 which engage a printed circuit board as will be described below.

The retainer 10 may further include means for selectively applying a force to move the slideable members 22, 24, 26, 28 and 30 towards one another along the rod 20. As embodied herein, the means for selectively applying a force to the slideable members comprises a headpiece 34 formed on one end of the rod 20, and screw-like threads 36 formed on the opposite ends of the rod. In this manner, as the rod threads 36 engage with mating threads, the rod may be rotated and advanced through the internal longitudinal channel 31 of the slideable members, thereby causing the inclined wedge-shaped surfaces 32 of respective members to "ride up" on the mating surfaces 32 of the adjacent member as the members are moved toward one another along the rod. Comparison of FIGS. 1 and 2 shows the movement of the members relative to one another as the assembly is moved between its unlocked (relaxed) state of FIG. 1 and locked (compressed) state of FIG. 2.

Figure 3A:
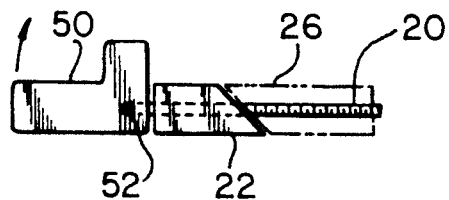
FIG. 3A is a schematic elevation of a second embodiment of a circuit card retainer of the present invention in its unexpanded configuration.
Figure 3B:
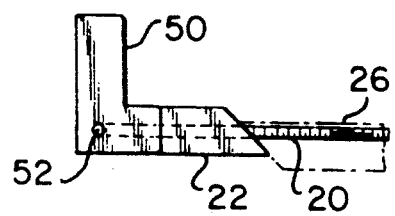
FIG. 3B is a schematic elevation of the circuit card retainer of FIG. 3A in its expanded configuration.

Alternatively, as shown in FIGS. 3A and 3B rather than rotating the rod to selectively apply a force, the device may be provided with an L-shaped lever 50 which engages one end of the rod using a pivot pin 52. As may be seen in FIGS. 3A and 3B, as the lever 50 is pivoted, the rod 20 is drawn backward with a result similar to that of tightening the screw in FIG. 2.

In a preferred embodiment, a nut 39 having internal threads 38 is fixedly attached to end member 24 and aligned with the channel in end member 24 through which the rod 20 is inserted. The threads 38 of nut 39 comprise the mating threads with which the rod threads 36 engage. As may be seen in FIG. 2, as the rod 20 is rotated or drawn in a first direction to engage rod threads 36 with mating threads 38 of nut 39, the slideable members 22, 24, 26, 28 and 30 are forced to move towards one another on rod 20 and the configuration of the inclined surfaces 32 of those members forces transverse members 26 and 30 in the transverse or radial direction 58 such that the clamping surfaces 33 of members 26 and 30 engage an edge surface of a printed circuit board and force the opposite edge of the printed circuit board into contact with a side wall of slot chassis within which the board is mounted, thereby anchoring the printed circuit board in place. Alternatively, end member 24 may include threads to engage the threaded portion 36 of the rod 20, thereby eliminating the nut 39.

Figure 4B:
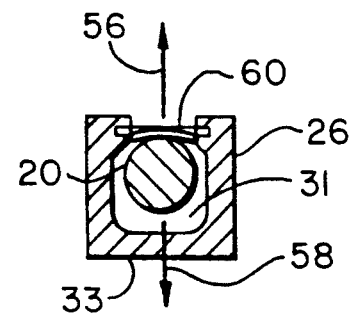
FIG. 4B is the view of FIG. 4A with the retainer in its expanded configuration.

The retainer 10 may optionally include means, attached at least to certain ones of the intermediate members, for applying a spring bias between those intermediate members and the rod. The means for applying such bias is embodied in leaf springs 60 which bias the intermediate members 26, 28 and 30 against rod 20 as illustrated in FIGS. 4A and 4B. This spring bias opposes movement of a respective intermediate member in the transverse directions 56 and 58 relative to rod 20.

FIGS. 4A and 4B illustrate in detail a representation of one of the optional leaf springs, in this instance, spring 60. The leaf spring is disposed so as to bias intermediate member 26 against rod 20. In FIG. 4A, leaf spring 60 is flexed such as in the case when intermediate member 26 is moved transversely to the rod to engage its clamping surface 33 against a circuit board. FIG. 4B illustrates the position of leaf spring 60 when the retainer is in an unlocked (uncompressed) position and clamping surface 33 of member 26 does not touch the circuit board. Leaf springs 60 serve to maintain the alignment of intermediate members relative to rod 20, to thereby facilitate removal and insertion of the printed circuit board from the chassis. As the rod 20 is rotated to unscrew rod threads 36 from mating threads 38, the spring bias action of leaf springs 60 acts to align the intermediate members and end members relative to one another.

Figure 5:
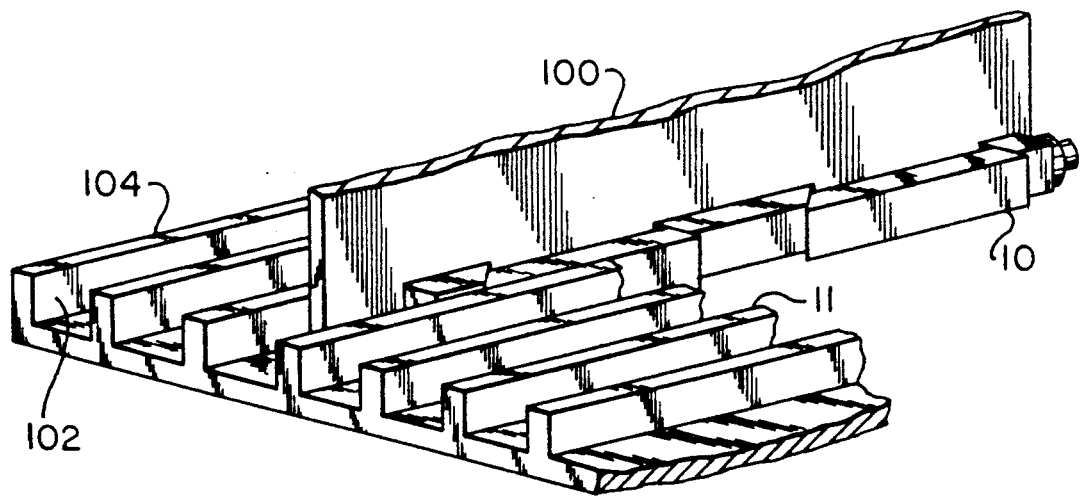
FIG. 5 is a perspective view of a retainer engaging a circuit board in a slot.

As shown in FIG. 5, a circuit card 100 may be positioned within a slot 102 of a card rack 104. The slot 102 has a width which is greater than that of the circuit board and an unexpanded retainer 10, but less than that of a circuit board and an expanded retainer. Thus, as shown in FIG. 5, when the retainer 10 is positioned in the slot 102 adjacent to a circuit board and then expanded, the board is caused to be firmly clamped within the slot.

When the retainer embodying the features described above is activated by withdrawing or torquing and rotating rod 20, pressure between clamping surfaces 33, circuit board 13 and a side wall is generated. The contact between these members also comprises a thermal interface between the circuit board and heat sink of the chassis. The high clamping pressure achievable with the present invention results in the circuit board being tightly held even during high shock or high vibration environments. Transfer of heat from the components mounted on the circuit board depends on the surface area, surface finish, and clamping pressure of the contact between the clamping surfaces which comprise the heat transfer path.

Because heat transfer is influenced by the amount of clamping pressure between clamping surfaces 33, the side wall, and the circuit board, the present invention acts to increase the effective amount of heat transfer from the circuit board due to its ability to efficiently transfer the force applied by rod 20 into the transversely directed clamping force of clamping surfaces 33. In addition the present invention provides some further heat transfer via the use of a rod 20 formed of an alkaline metal material such as an aluminum alloy.

The use of alkaline metal materials in the fabrication of the rod 20 is believed to have been unknown in the prior art as a result of the belief that alkaline metal alloys meeting the desired physical and mechanical requirements were not available. As used herein, the term alkaline metals is intended to mean light metals from the lower groups of the periodic table including aluminum, magnesium, titanium and the like. Alkaline metal alloys are those metallic alloys having, as a substantial constituent, one or more alkaline metals.

The properties of alkaline metals offer numerous advantages over the ferrous metals used in the prior art. Whereas ferrous metals typically have a minimum density of approximately 0.29 $lb/in^3$, alkaline metals and their alloys commonly have a maximum density of approximately 0.10 $lb/in^3$. Likewise, whereas ferrous metals typically have a thermal conductivity on the order of 10–15 $Btu.ft/hr.ft^2 \cdot °F$., alkaline metals and their alloys have a minimum conductivity of approximately 30 $Btu.ft/hr.ft^2 \cdot °F$.

The applicants have discovered that alkaline metal alloys can be used to fabricate rods which exhibit satisfactory tensile strength, (greater than about 600 psi), to allow their use in circuit card retainer applications. In fact, as may be seen in Table 1 below, certain alkaline metal alloys offer substantial improvements in weight and thermal conductivity while sacrificing little, if any, in terms of desired mechanical properties.

Specifically, Table 1 offers a comparison of the properties of a particular aluminum alloy, 7075 aluminum, that has been tempered to yield a rod having mechanical properties comparable to those of a stainless steel material, 303 CRES, that is typically used in the fabrication of circuit card retainer rods.

TABLE 1

| COMPARISON OF PHYSICAL AND MECHANICAL PROPERTIES BETWEEN 7075 ALUMINUM AND 303CRES STAINLESS STEEL | | |
|---|---|---|
|  | 7075 AL[1] | 303 CRES[2] |
| Physical Properties | | |
| Density ($lb/in^3$) | 0.101 | 0.29 |
| Thermal Conductivity ($Btu \cdot ft/hr \cdot ft^2 \cdot °F$.) | 70 | 9.6 |
| Mechanical Properties | | |
| Tensile Strength(10 PSI) | 83 | 90 |
| Yield Strength(10 PSI) | 73 | 35–75 |
| Elongation in 2 in (%) | 11 | 30 |
| Hardness (Brinell) | 150 | 160 |

[1]Materials Engineering, "Material Selector", Penton Publishing, 1992, p. 73
[2]Ibid p. 44

The particular material used, 7075 aluminum, is a readily available alloy of aluminum, zinc, magnesium, copper and chromium. Tempering is achieved by heat soaking the alloy in a molten salt bath at a temperature of between about 870°–890° F., quenching the alloy in water at about 160° F., and then placing the quenched alloy in a hardening oven at about 240°–260° F. for approximately 20–23 hours. The resulting properties, shown in Table I, are referred to as a T6 temper. Further details of the processing conditions are specified in ASTMB209.

Table 1 above shows that alkaline metal alloys which meet the mechanical requirements of a circuit card retainer rod, while offering substantial improvements in weight savings and thermal conductivity, may be obtained.

The invention is not intended to be limited to 7075 aluminum. Rather, the invention is intended to pertain to the use of the class of alkaline metal alloys that can be tempered, using various processes, to yield a tensile strength of at least about 600 psi, the minimum believed to be useful for rods of circuit card retainers. Thus, other aluminum alloys, such as 8085 aluminum, may be used, as well as alloys of other metals such as magnesium, titanium and the like. For example, an alloy material comprising primarily magnesium, which is approximately 30% lighter than aluminum, may be substituted for the rod material. Thus, it is intended that retainers having rods made of materials having tensile strengths approximating those of stainless steel, but lower densities, may be used.

It is noted that in certain circumstances, the alkaline metal alloy rod may be fabricated to slightly sturdier dimensions in order to overcome minor inherent decreases in mechanical properties as compared to stainless steel rods. However, such enhancements are considered to be mere design changes that will be readily apparent to those having ordinary skill in the art. Furthermore, as a result of the substantially lower density, minor increases in the overall dimensions of alkaline metal alloy rods as compared to stainless steel rods still result in a substantial overall weight saving.

In the case of typical circuit card retainers having a length of between approximately 5 and 6 inches, the use of 7075 aluminum rods has been found to provide a weight reduction of between approximately 28–38% in the retainer. In addition, the use of such rods is believed to provide a circuit card retainer having greater thermal transfer potential than the circuit card retainers known to exist in the prior art.

Although a retainer employing a total of five members is disclosed herein, retainers having fewer or greater members are also contemplated, depending upon the length of the circuit board to be mounted. Similarly, other retainers incorporating the wedge-shaped members are intended to be included as well. These include, for example, the retainers described in the previously incorporated U.S. Pat. No. 5,038,428 which includes additional elements.

Additional advantages and modifications will be readily apparent to those skilled in the art. The invention in its broader aspects is not limited to the specific details, representative apparatus, and illustrative examples shown and described. Accordingly, departure may be made from such details without departing from the spirit or scope of the inventive concept. Rather, the scope of the invention is that embodied by the following claims:

What is claimed is:

1. A retainer for holding a circuit card between spaced surfaces comprising:
    a rod formed of an alkaline metal alloy tempered to have a tensile strength of at least about 600 psi;
    a plurality of members slideably mounted end-to-end on said rod, at least one of said members having an internal longitudinal channel having a transverse dimension greater than the corresponding outside dimension of said rod to permit movement of said one member along a transverse path relative to said rod, said one member and members adjacent said one member each having end portions engagable to one another and shaped to force said one member to move in a first direction along said transverse path relative to said adjacent members upon forcing of said adjacent members toward said one member; and
    first means for forcing said adjacent members towards said one member.

2. A retainer as in claim 1 which further includes a second means, attached to said one member, opposing movement of said one member in said first direction.

3. A retainer as in claim I wherein the rod is formed of 7075 aluminum.

4. A retainer as in claim 3 wherein the rod is tempered to have a tensile strength of at least about 800 psi.

5. A retainer for holding a printed circuit card between spaced surfaces comprising:
    a rod formed of an alkaline metal alloy having a tensile strength of at least approximately 600 psi and a thermal conductivity of at least approximately 30 Btu.ft/hr$^2$.° F.;
    a plurality of members slideably mounted end-to-end on said rod, at least one of said members having an internal longitudinal channel having a transverse dimension greater than the corresponding outside dimension of said rod to permit movement of said one member along a transverse path relative to said rod, said one member and members adjacent said one member each having end portions engagable to one another and shaped to force said one member to move in a first direction along said transverse path relative to said adjacent members upon forcing of said adjacent members toward said one member; and
    first means for forcing said adjacent members towards said one member.

6. A retainer as in claim 5 which further includes a second means, attached to said one member, opposing movement of said one member in said first direction.

7. A retainer as in claim 5 wherein the rod further has a density of less than about 0.2 lb/in$^3$.

8. A retainer as in claim 5 wherein the rod is formed of 7075 aluminum.

9. A retainer for holding a printed circuit card between spaced surfaces comprising:
    a rod formed of a an alkaline metal alloy having a tensile strength of at least approximately 600 psi and a density of less than about 0.2 lb/in$^3$;
    a plurality of members slideably mounted end-to-end on said rod, at least one of said members having an internal longitudinal channel having a transverse dimension greater than the corresponding outside dimension of said rod to permit movement of said one member along a transverse path relative to said rod, said one member and members adjacent said one member each having end portions engagable to one another and shaped to force said one member to move in a first direction along said transverse path relative to said adjacent members upon forcing of said adjacent members toward said one member; and
    first means for forcing said adjacent members towards said one member.

10. A retainer as in claim 9 which further includes a second means, attached to said one member, opposing movement of said one member in said first direction.

11. A retainer as in claim 9 wherein the rod is formed of 7075 aluminum.

* * * * *